United States Patent [19]

Kleefstra et al.

[11] Patent Number: 5,103,389
[45] Date of Patent: Apr. 7, 1992

[54] FREQUENCY RANGE OF ANALOG CONVERTER BY MEANS OF EXTERNAL RECTIFIER

[75] Inventors: Meindert Kleefstra, Solon; George Topala, Lakewood, both of Ohio

[73] Assignee: Keithley Instruments, Inc., Cleveland, Ohio

[21] Appl. No.: 713,758

[22] Filed: Jun. 11, 1991

[51] Int. Cl.⁵ .................................... H02M 7/04
[52] U.S. Cl. ..................... 363/127; 328/26; 307/261
[58] Field of Search ............... 363/125, 126, 127, 128; 328/26, 32, 262; 324/119; 307/260, 261, 262; 323/354, 297

[56] References Cited

U.S. PATENT DOCUMENTS

| | | |
|---|---|---|
| 3,165,694 | 1/1965 | Young . |
| 3,311,826 | 3/1967 | Galman . |
| 3,382,451 | 5/1968 | Gillette et al. . |
| 3,411,066 | 11/1968 | Bravenec . |
| 3,517,298 | 6/1970 | Richman . |
| 3,938,040 | 2/1976 | Lofmark . |
| 3,942,095 | 3/1976 | Togneri et al. . |
| 3,944,906 | 3/1976 | Hill et al. . |
| 3,971,984 | 7/1976 | Bench . |
| 4,109,308 | 8/1978 | Rodel . |
| 4,127,810 | 11/1978 | Purland . |
| 4,176,393 | 11/1979 | Pungas et al. . |
| 4,307,305 | 12/1981 | Morris .................. 363/127 |
| 4,564,814 | 1/1986 | Miura et al. ........... 328/26 |
| 4,571,502 | 2/1986 | Kimura et al. ......... 307/262 |
| 4,713,973 | 12/1987 | Woyton . |
| 4,959,608 | 9/1990 | Dillman . |

Primary Examiner—Peter S. Wong
Attorney, Agent, or Firm—Pearne, Gordon, McCoy & Granger

[57] ABSTRACT

The frequency range and accuracy of a commercially available RMS converter is improved by providing an improved rectifier ahead of the converter's internal rectifier. The improved rectifier switches between the input signal and an inverted version of the input signal in response to a high speed comparator. The improved rectifier can also incorporate range selecting circuitry.

6 Claims, 4 Drawing Sheets

FREQUENCY RANGE OF ANALOG CONVERTER BY MEANS OF EXTERNAL RECTIFIER

BACKGROUND OF THE INVENTION

The present invention relates to a full-wave rectifier circuit and in particular to a means for improving the frequency of an RMS (root mean-square) converter.

Referring to FIG. 1, a typical commerically available analog log-antilog computing RMS converter 10 is illustrated (e.g., Analog Devices AD637). These RMS converters are provided in the form of pre-packaged integrated circuits.

The input signal is applied to terminal 12. The resistors 14, 16, the op-amp 18, and the diodes 20, 22 act as an inverting half-wave rectifier. The resistors 24, 26 form a summing stage that results in a full-wave rectified version of the input signal at the inverting input of the amplifier 28. The remainder of the RMS converter provides the necessary log-antilog functions and averaging (note the external averaging capacitor 30) in order to provide an output signal at the terminal 32 indicative of the RMS value of the input signal.

The pre-packaged, commerically available RMS converter 10 is typically useful for input signal frequencies up to 100 kilohertz. At 1 megahertz, the error can be as much as 10 percent. This is primarily due to the capacitances of the diodes 20, 22 which prevent the rapid switching of the half-wave rectifier necessary for higher frequency operation.

SUMMARY OF THE INVENTION

The present invention provides a very accurate high frequency full-wave rectifier. By placing this rectifier ahead of the input to an RMS converter having a rectifier that limits the frequency response of the converter, the frequency range-limiting rectifier is effectively bypassed. Effectively, the internal rectifier is replaced by a rectifier with higher accuracy and frequency range. This allows the converter to be used at much higher frequencies (e.g., 0.5 percent accuracy at 1 megahertz over a wide voltage range).

The rectifier of the invention includes an op-amp having an inverting input terminal, a non-inverting input terminal and an output terminal. The non-inverting input terminal is at a reference voltage;

A comparator responsive to the input signal provides a control signal indicative of the polarity of the input signal.

Also included is a first switch responsive to the control signal. The first switch has a first and second terminal and is "on" when the input signal is of a first polarity and "off" when the input signal is of a second polarity. The first switch first terminal is connected to the op-amp inverting input terminal.

A second switch responsive to the control signal is also included. The second switch has a first and second terminal and is "off" when the input signal is of the first polarity and "on" when the input signal is of the second polarity. The second switch first terminal is connected to the op-amp inverting input terminal.

An inverter having an input terminal and an output terminal is included. The input terminal is connected to the input signal.

A first resistance is connected between the inverter input terminal and the first switch second terminal.

A second resistance is connected between the first switch second terminal and the op-amp output terminal.

A third resistance is connected between the inverter output terminal and the second switch second terminal.

A fourth resistance is connected between the second switch second terminal and the op-amp output terminal.

In operation, a rectified version of the input signal appears at the op-amp output terminal.

The frequency range of an RMS converter having an input terminal and an output terminal may be extended where the input terminal is connected to a frequency range-limiting rectifier within the converter.

An extended frequency range rectifier having an input terminal and an output terminal is provided. The input signal is connected to the extended frequency range rectifier input terminal and the extended frequency range rectifier output terminal is connected to the converter input terminal. In operation, a rectified version of the input signal is applied to the converter thereby extending the frequency range and accuracy of the converter.

In the preferred embodiment, the extended frequency range rectifier is a rectifier as described above.

DESCRIPTION OF THE PREFERRED EMBODIMENTS

Figure 1:
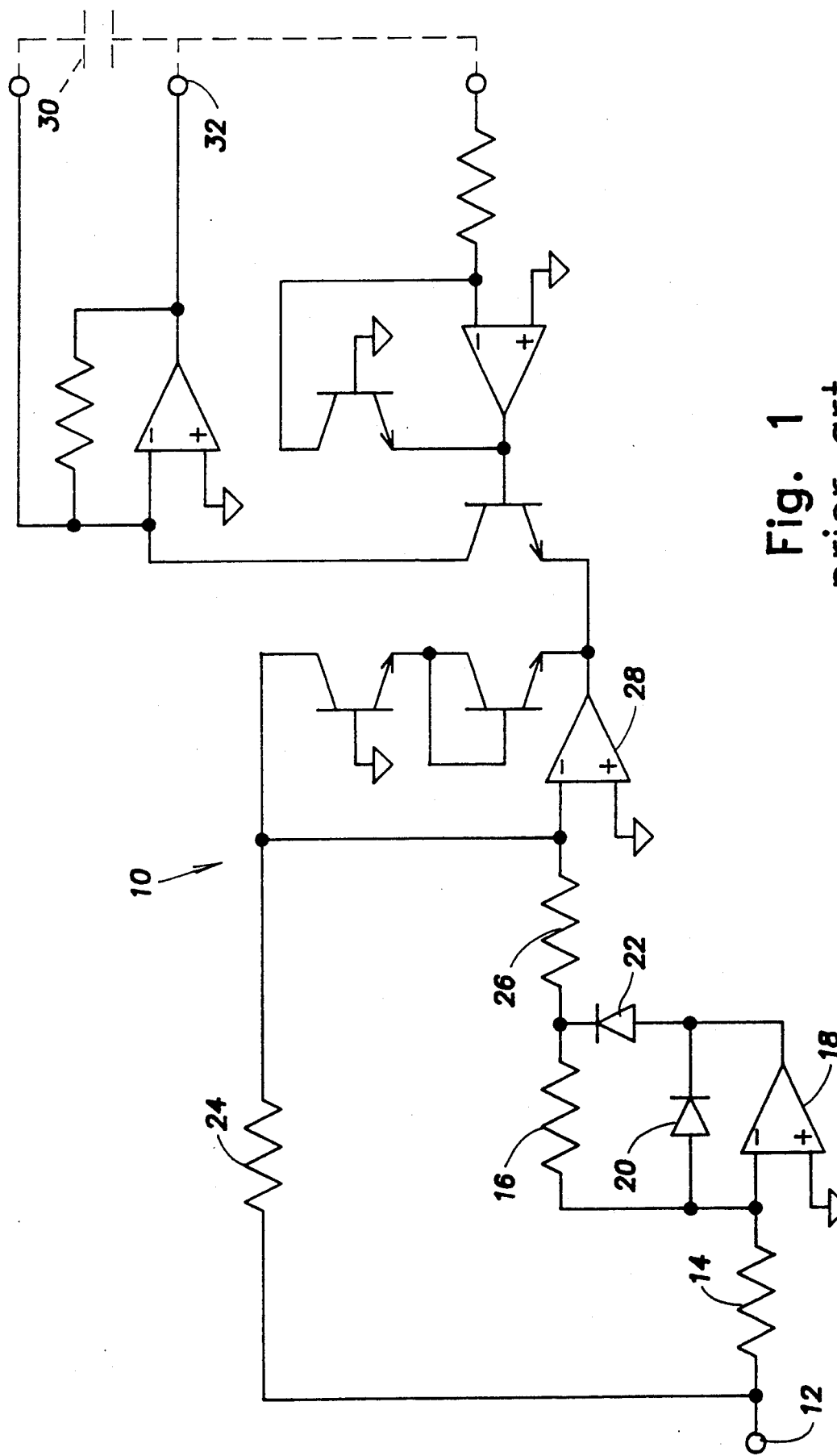
FIG. 1 is a schematic diagram of a typical commerically available RMS converter.
Figure 2:
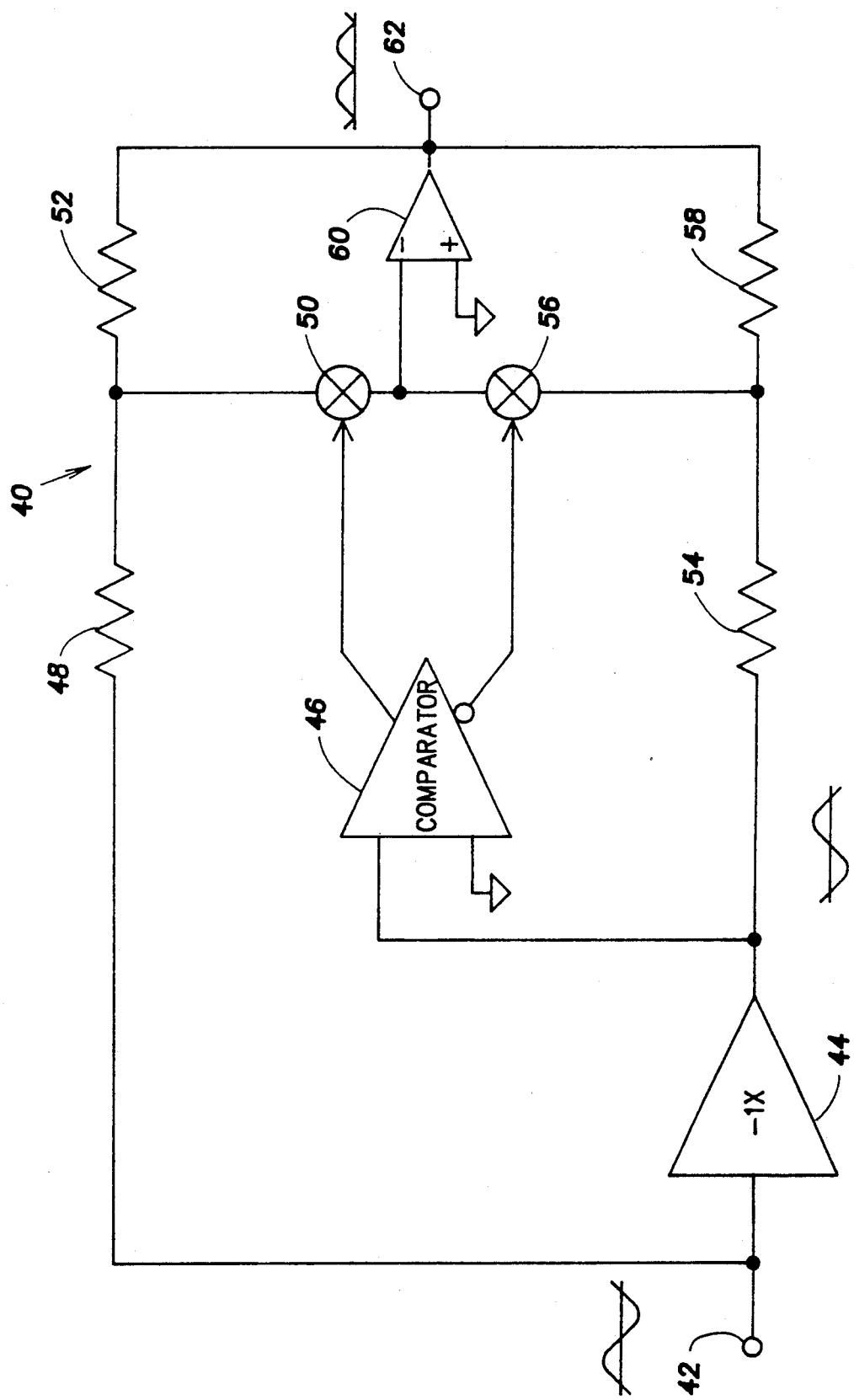
FIG. 2 is a schematic diagram of a rectifier circuit according to the invention.

Referring to FIG. 2, a circuit 40 is illustrated. An input terminal 42 is connected to the input of an inverter 44 and to one terminal of a resistor 48. The other terminal of the resistor 48 is connected to the first terminal of a switch 50 and one terminal of a resistor 52.

The output of the inverter 44 is connected to one terminal of a resistor 54 and to the input of a comparator 46. The other terminal of the resistor 54 is connected to the first terminal of a switch 56 and one terminal of a resistor 58. The reference input of the comparator 46 is connected to signal ground.

The second terminals of the switches 50, 56 are connected to the inverting input of an op-amp 60. The non-inverting input of the op-amp 60 is connected to signal ground. The other terminals of the resistors 52, 58 are connected to the output of the op-amp 60 and to the output terminal 62.

The output of the comparator 46 provides a control signal to the switch 56 and the complemented output of the comparator 46 provides a control signal to the switch 50.

The inverter 44 and the op-amp 60 are accurate, high speed, high slew rate (e.g., greater than 200 volts/microsecond) devices. The comparator 46 may be, for example, a high speed complementary comparator such as a Linear Technology LT1016. The switches 50, 56 may be, for example, DMOS FETs (e.g., Siliconix SD5000).

In operation, an input signal is applied to the input terminal 42. The inverter 44 provides an inverted version of the input signal at its output.

If the input signal is positive, the comparator 46 provides a control signal to the switch 56 to turn "on" the switch 56 to provide the inverted input signal through the resistor 54 to the inverting input of the op-amp 60 and provides a control signal to the switch 50 to turn "off" the switch 50 to block the non-inverted input signal from reaching the op-amp 60.

The signal appearing at the output terminal 62 is then the same as the input signal, except scaled by the ratio of the resistor 58 to the resistor 54.

If the input signal is negative, the comparator 46 provides a control signal to the switch 56 to turn "off" the switch 56 to block the inverted input signal from reaching the op-amp 60 and provides a control signal to the switch 50 turn "on" the switch 50 to provide the input signal through the resistor 48 to the inverting input of the op-amp 60.

The signal appearing at the output terminal 62 is then the same as the input signal, except inverted and scaled by the ratio of the resistor 52 to the resistor 48.

As a result, the signal at the output terminal 62 is never negative, the circuit 40 acting as a full-wave rectifier.

The resistance of the switches 50, 56 when they are "on" will have no effect on the accuracy of the circuit 40 (no current flows through the switches 50, 56).

Figure 3:
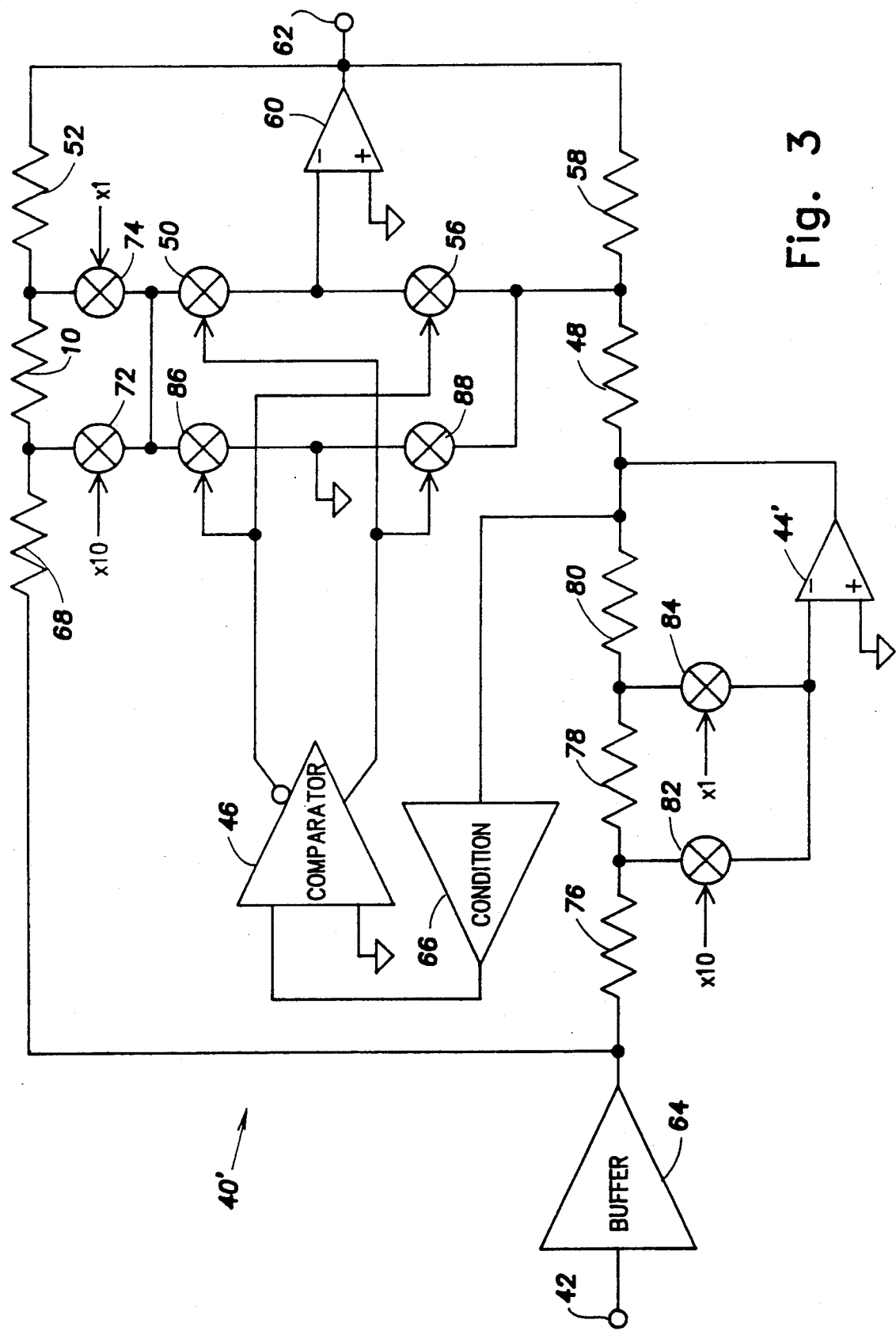
FIG. 3 is a schematic diagram of an additional embodiment of a rectifier circuit according to the invention.

Referring to FIG. 3, circuit 40' is illustrated. The circuit 40' is similar to the circuit 40. A buffer amplifier 64 is added at the input 42 of the circuit 40' and a conditioning amplifier 66 is added at the input of the comparator 46 to ensure reliable switching at extremely low voltages. Both of these amplifiers are accurate, high speed, high slew rate amplifiers.

The resistor 54 has been replaced by resistors 68, 70 and the switches 72, 74. One terminal of the resistor 68 is connected to the output of the buffer amplifier 64. The other terminal of the resistor 68 is connected to one terminal of the resistor 70 and to the first terminal of the switch 72. The other terminal of the resistor 70 is connected to the resistor 52 and the first terminal of the switch 74. The second terminals of the switches 72, 74 are connected to the first terminal of the switch 50.

Range-selecting control signals X1 and X10 control which of the switches 72, 74 are "on". If the switch 72 is on (and the switch 74 off), the resistor 70 is added to the resistor 52 and the gain of the circuit 40' for negative input signals is the negative of the ratio of this sum to the resistor 68. If the switch 74 is on (and the switch 72 off), the resistor 70 is added to the resistor 68 and the gain of the circuit 40' for negative input signals is the negative of the ratio of the resistor 52 to this sum.

The inverter 44 has been replaced by a scaling inverter circuit composed of resistors 76, 78, 80, switches 82, 84 and an op-amp 44'. One terminal of the resistor 76 is connected to the output of the buffer amplifier 64. The other terminal of the resistor 76 is connected to the first terminal of the switch 82 and one terminal of the resistor 78. The other terminal of the resistor 78 is connected to the first terminal of the switch 84 and the first terminal of the resistor 80. The other terminal of the resistor 80 is connected to the input of the conditioning amplifier 66 and to the output of the op-amp 44'. The second terminals of the switches 82, 84 are connected to the inverting input of the op-amp 44'. The non-inverting input of the op-amp 44' is connected to signal ground.

The range-selecting control signals X1 and X10 also control which of the switches 82, 84 are "on". If the switch 82 is on (and the switch 84 off), the resistor 78 is added to the resistor 80 and the gain of the scaling inverter circuit is the negative of the ratio of this sum to the resistor 76. If the switch 84 is on (and the switch 82 off), the resistor 78 is added to the resistor 76 and the gain of the scaling inverter circuit is the negative of the ratio of the resistor 80 to the this sum.

For positive input signals, the gain of the circuit 40' is the negative of the ratio of the resistor 58 to the resistor 48 times the gain of the scaling inverter circuit. Of course, for symmetric full-wave rectification, the gain for negative input signals must be equal to the negative of the gain for negative input signals.

It should be noted that, whatever the polarity of the input signal, the comparator 46 receives a scaled version of the input signal from the scaling inverter circuit, thus scaling is accomplished for both the rectifier and the comparator.

A switch 86 is connected between the first terminal of the switch 50 and signal ground. A switch 88 is connected between the first terminal of the switch 56 and signal ground. The output of the comparator 46 provides a control signal to the switch 88 and the complemented output provides a control signal to the switch 86.

When the switch 50 is "off", the switch 86 is "on" thus zeroing the voltage across the switch 50. Similarly, when the switch 56 is "off", the switch 88 is "on", zeroing the voltage across the switch 56. This is because, while the switches 50, 56 have very low charge injection, very high speed and relatively low "on" resistance, at higher drain voltages, they will turn on independently of the value of the control signals. With the switches 86, 88 added, the switches 50, 56 always have zero voltage across them.

The switches 86, 88 may be, for example, DMOS FETs (SD5000 is a quad-pack of such transistors). The switches 72, 74, 82, 84 may be, for example, low capacitance JFETs.

Figure 4:
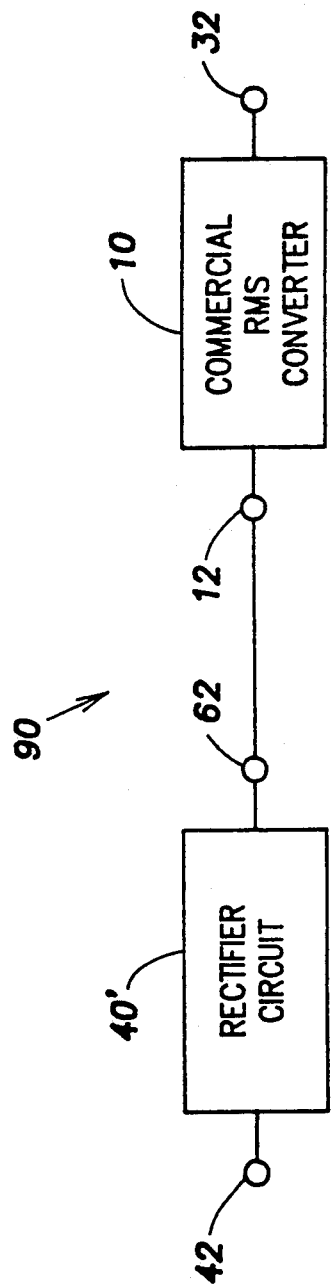
FIG. 4 is a block diagram of an RMS converter according to the invention.

Referring to FIG. 4, an extended frequency range and accuracy RMS converter 90 is shown. The rectifier circuit 40' is connected to the input of a pre-packaged, commerically available, RMS converter 10 that contains an internal frequency range-limiting rectifier. Because only a positive signal is passed from the circuit 40' to the converter 10, the internal rectifier of the converter 10 is completely bypassed. This results in an extended frequency range for the converter 90, as well as improved accuracy at very low signal levels (when switching in the internal rectifier becomes uncertain).

The rectifier section of the RMS converter 10 is such that it directly passes positive inputs. If it was instead configured to directly pass negative inputs, the output polarity of the rectifier circuit 40' would be inverted (e.g., by changing the sense of the comparator 46).

It should be evident that this disclosure is by way of example and that various changes may be made by adding, modifying or eliminating details without departing from the fair scope of the teaching contained in this disclosure. The invention is therefore not limited to particular details of this disclosure except to the extent that the following claims are necessarily so limited.

What is claimed:
1. A circuit for rectifying an input signal comprising:
an op-amp having an inverting input terminal, a non-inverting input terminal and an output terminal, said non-inverting input terminal being at a reference voltage;

a comparator responsive to said input signal for providing a control signal indicative of the polarity of the input signal;

a first switch responsive to said control signal, said switch having a first and second terminal and being "on" when said input signal is of a first polarity and "off" when said input signal is of a second polarity, said first switch first terminal being connected to said op-amp inverting input terminal;

a second switch responsive to said control signal, said second switch having a first and second terminal and being "off" when said input signal is of said first polarity and "on" when said input signal is of said second polarity, said second switch first terminal being connected to said op-amp inverting input terminal;

an inverter having an input terminal and an output terminal, said input terminal being connected to said input signal;

a first resistance connected between said inverter input terminal and said first switch second terminal;

a second resistance connected between said first switch second terminal and said op-amp output terminal;

a third resistance connected between said inverter output terminal and said second switch second terminal; and a fourth resistance connected between said second switch second terminal and said op-amp output terminal, wherein a rectified version of said input signal appears at said op-amp output terminal.

2. A circuit according to claim 1, wherein at least one of said resistances are switch selectable to provide scaling of said rectified version of said input signal.

3. A circuit according to claim 2, wherein said inverter provides a scaled inverted version of said input signal to said comparator and third resistor.

4. A method for extending the frequency range of an RMS converter having an input terminal and an output terminal, said input terminal being connected to a frequency range-limiting rectifier within said converter, said method comprising:

providing an extended frequency range rectifier having an input terminal and an output terminal;

connecting an input signal to said extended frequency range rectifier input terminal; and connecting said extended frequency range rectifier output terminal to said converter input terminal, whereby a rectified version of said input signal is applied to said converter thereby extending the frequency range and accuracy of said converter.

5. A method according to claim 4, wherein said extended frequency range rectifier comprises:

an op-amp having an inverting input terminal, a non-inverting input terminal and an output terminal, said non-inverting input terminal being at a reference voltage and said op-amp output terminal being connected to said extended frequency range rectifier output terminal;

a comparator responsive to said input signal for providing a control signal indicative of the polarity of the input signal;

a first switch responsive to said control signal, said switch having a first and second terminal and being "on" when said input signal is of a first polarity and "off" when said input signal is of a second polarity, said first switch first terminal being connected to said op-amp inverting input terminal;

a second switch responsive to said control signal, said second switch having a first and second terminal and being "off" when said input signal is of said first polarity and "on" when said input signal is of said second polarity, said second switch first terminal being connected to said op-amp inverting input terminal;

an inverter having an input terminal and an output terminal, said inverter input terminal being connected to said extended frequency range rectifier input terminal;

a first resistance connected between said inverter input terminal and said first switch second terminal;

a second resistance connected between said first switch second terminal and said op-amp output terminal;

a third resistance connected between said inverter output terminal and said second switch second terminal; and a fourth resistance connected between said second switch second terminal and said op-amp output terminal, wherein a rectified version of said input signal appears at said op-amp output terminal.

6. An extended frequency range RMS converter for converting an input signal comprising:

a commercially available RMS converter having a frequency range-limiting rectifier therein, said commercially available RMS converter having an external signal input terminal and an external signal output terminal;

an op-amp having an inverting input terminal, a non-inverting input terminal and an output terminal, said non-inverting input terminal being at a reference voltage and said op-amp output terminal being connected to said external signal input terminal;

a comparator responsive to said input signal for providing a control signal indicative of the polarity of the input signal;

a first switch responsive to said control signal, said switch having a first and second terminal and being "on" when said input signal is of a first polarity and "off" when said input signal is of a second polarity, said first switch first terminal being connected to said op-amp inverting input terminal;

a second switch responsive to said control signal, said second switch having a first and second terminal and being "off" when said input signal is of said first polarity and "on" when said input signal is of said second polarity, said second switch first terminal being connected to said op-amp inverting input terminal;

an inverter having an input terminal and an output terminal, said inverter input terminal being connected to said external signal input terminal;

a first resistance connected between said inverter input terminal and said first switch second terminal;

a second resistance connected between said first switch second terminal and said op-amp output terminal;

a third resistance connected between said inverter output terminal and said second switch second terminal; and a fourth resistance connected between said second switch second terminal and said op-amp output terminal, wherein a rectified version of said input signal appears at said external signal input terminal and a more accurate RMS signal appears at said external signal output terminal.

* * * * *